(12) United States Patent
Chen et al.

(10) Patent No.: US 10,707,322 B2
(45) Date of Patent: Jul. 7, 2020

(54) SEMICONDUCTOR DEVICES AND METHODS FOR FABRICATING THE SAME

(71) Applicant: Vanguard International Semiconductor Corporation, Hsinchu (TW)

(72) Inventors: Chih-Yen Chen, Tainan (TW); Shin-Cheng Lin, Tainan (TW); Hsin-Chih Lin, Hsinchu (TW)

(73) Assignee: VANGUARD INTERNATIONAL SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 16/166,558

(22) Filed: Oct. 22, 2018

(65) Prior Publication Data

US 2020/0127116 A1 Apr. 23, 2020

(51) Int. Cl.
*H01L 29/66* (2006.01)
*H01L 21/02* (2006.01)
*H01L 29/778* (2006.01)
*H01L 29/08* (2006.01)
*H01L 29/45* (2006.01)

(52) U.S. Cl.
CPC .... *H01L 29/66462* (2013.01); *H01L 21/0254* (2013.01); *H01L 29/0843* (2013.01); *H01L 29/452* (2013.01); *H01L 29/778* (2013.01)

(58) Field of Classification Search
CPC ............. H01L 21/0254; H01L 29/0843; H01L 29/452; H01L 29/66462; H01L 29/778
See application file for complete search history.

(56) References Cited

U.S. PATENT DOCUMENTS

| | | | | |
|---|---|---|---|---|
| 10,522,647 | B2* | 12/2019 | Chiu | H01L 21/0217 |
| 10,541,321 | B2* | 1/2020 | Okamoto | H01L 29/4232 |
| 2011/0115025 | A1* | 5/2011 | Okamoto | H01L 21/76898 257/368 |
| 2013/0264657 | A1* | 10/2013 | Komatani | H01L 29/7848 257/402 |
| 2013/0334538 | A1 | 12/2013 | Saunier | |
| 2015/0349117 | A1* | 12/2015 | Chu | H01L 29/7827 257/66 |
| 2016/0172474 | A1* | 6/2016 | Miyake | H01L 29/7783 257/76 |
| 2016/0260615 | A1* | 9/2016 | Hirai | H01L 21/28114 |
| 2018/0286810 | A1* | 10/2018 | You | H01L 29/41725 |
| 2018/0308953 | A1* | 10/2018 | Chiu | H01L 21/0217 |
| 2019/0097001 | A1* | 3/2019 | LaRoche | H01L 23/485 |
| 2019/0296139 | A1* | 9/2019 | Wei | H01L 29/2003 |

FOREIGN PATENT DOCUMENTS

TW 201813092 A 4/2018

* cited by examiner

*Primary Examiner* — Allan R Wilson
(74) *Attorney, Agent, or Firm* — Birch, Stewart, Kolasch & Birch, LLP (57) ABSTRACT

A semiconductor device includes a channel layer disposed over a substrate, a barrier layer disposed over the channel layer, a gate electrode disposed over the barrier layer, and a pair of source/drain electrodes disposed on opposite sides of the gate electrode. The pair of source/drain electrodes extend through at least portions of the barrier layer. The semiconductor device also includes a lining layer conformally disposed on bottom portions of the pair of source/drain electrodes.

20 Claims, 7 Drawing Sheets

SEMICONDUCTOR DEVICES AND METHODS FOR FABRICATING THE SAME

BACKGROUND

Technical Field

The disclosure relates to semiconductor devices, and more particularly, to high electron mobility transistors and methods for fabricating the same.

Description of the Related Art

Gallium nitride-based (GaN-based) semiconductor materials have many excellent characteristics, such as high thermal resistance, wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMT) with heterogeneous interfacial structures.

One of the most important factors affecting the power consumption of a semiconductor device is its On-Resistance ($R_{on}$), which is proportional to the power consumption of the semiconductor device. On-Resistance ($R_{on}$) includes source/drain contact resistance ($R_{contact}$) and channel resistance ($R_{channel}$). High electron mobility transistors (HEMTs) have two-dimensional electron gas (2DEG) formed at a heterogeneous interface resulting in $R_{channel}$ of HEMTs is low due to high electron mobility and high carrier density of 2DEG. Therefore, On-Resistance ($R_{on}$) of HEMTs generally depends on the value of source/drain contact resistance ($R_{contact}$).

With the developments being made in GaN-based semiconductor materials, semiconductor devices that use GaN-based semiconductor materials are being applied in more critical working environments, such as those with higher frequencies or higher temperatures. Therefore, the process of fabricating semiconductor devices with GaN-based semiconductor materials faces various new challenges.

SUMMARY

Some embodiments of the present disclosure provide a semiconductor device. The semiconductor device includes a channel layer disposed over a substrate, a barrier layer disposed over the channel layer, a gate electrode disposed over the barrier layer, and a pair of source/drain electrodes disposed on opposite sides of the gate electrode and extending through at least portions of the barrier layer. The semiconductor device also includes a lining layer conformally disposed on bottom portions of the pair of source/drain electrodes.

Some embodiments of the present disclosure provide a method for fabricating a semiconductor device. The method includes forming a channel layer over a substrate, forming a barrier layer over the channel layer, recessing the barrier layer to form a pair of recesses through at least portions of the barrier layer, conformally forming a lining layer in the pair of recesses, forming a pair of source/drain electrodes in the respective remaining portions of the pair of recesses, and forming a gate electrode over the barrier layer. The pair of source/drain electrodes are located on opposite sides of the gate electrode.

In order to make features and advantages of the present disclosure easy to understand, a detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

The embodiments of the present disclosure provide semiconductor devices, particularly suitable for high electron mobility transistors (HEMTs), and methods of fabricating the same. Generally, two-dimensional electron gas (2DEG) can be formed at a heterogeneous interface between a channel layer and a barrier layer as conductive carriers for HEMTs. However, when recesses for forming source/drain electrodes extend through a barrier layer and extend further into a channel layer, the heterogeneous interface between the channel layer and the barrier layer is not present in the region where the source/drain electrodes are formed, which reduces or eliminates 2DEG beneath the source/drain electrodes. In the embodiments of the present disclosure, the semiconductor devices include a lining layer disposed on the bottom portions of the source/drain electrodes. The lining layer can recover or increase 2DEG beneath the source/drain electrodes. Thus, the On-Resistance ($R_{on}$) of the semiconductor device can be reduced.

Figure 1A:
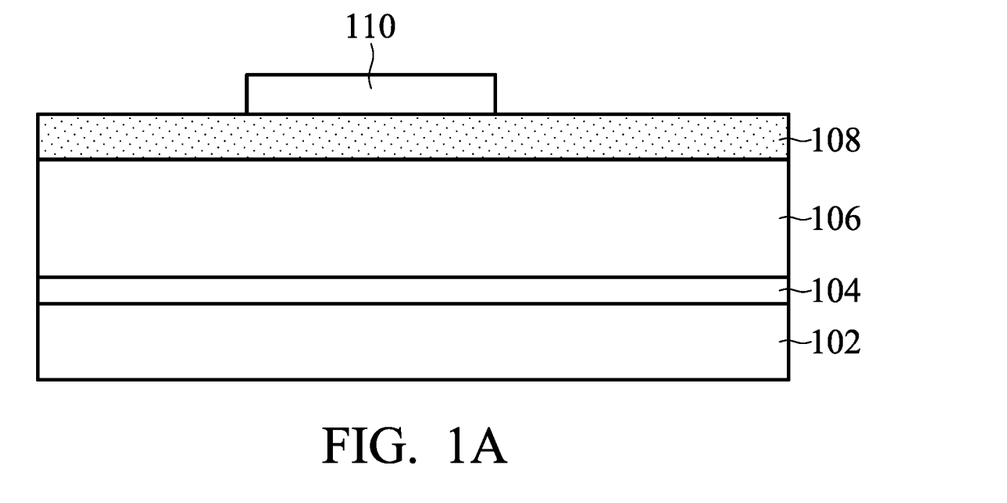
FIGS. 1A-1F illustrate cross-sectional views of forming a semiconductor device at intermediate stages in accordance with some embodiments of the present disclosure.
Figure 1B:
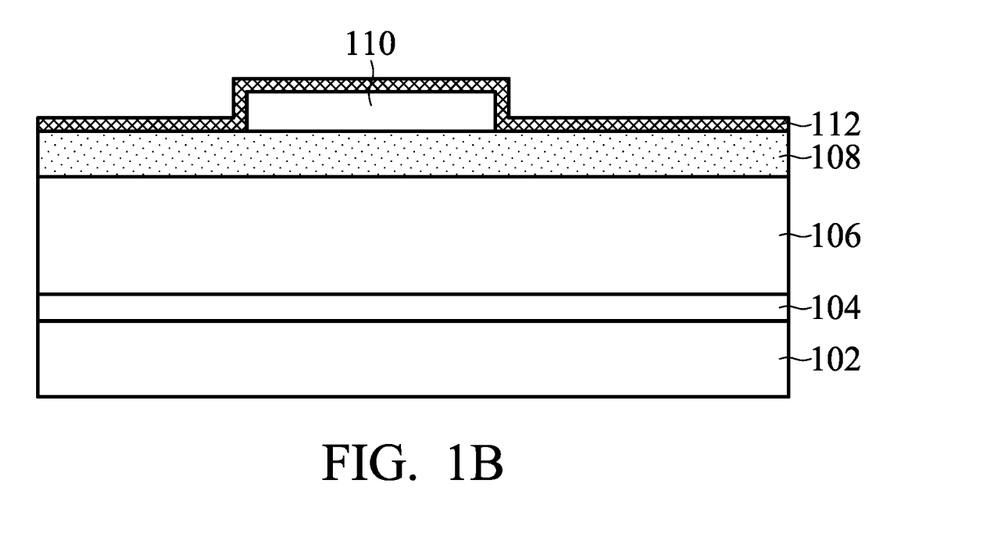
Figure 1C:
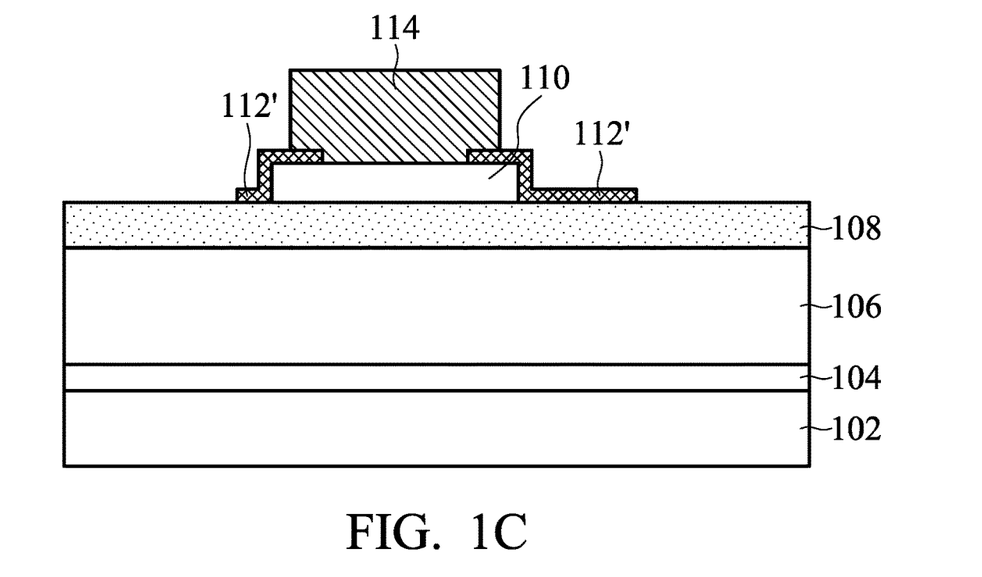
Figure 1D:
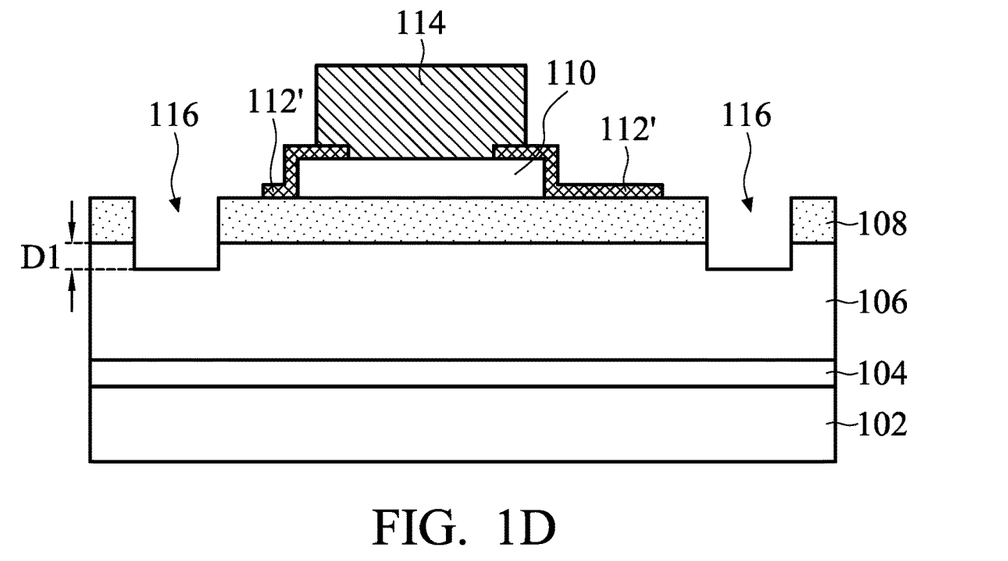
Figure 1E:
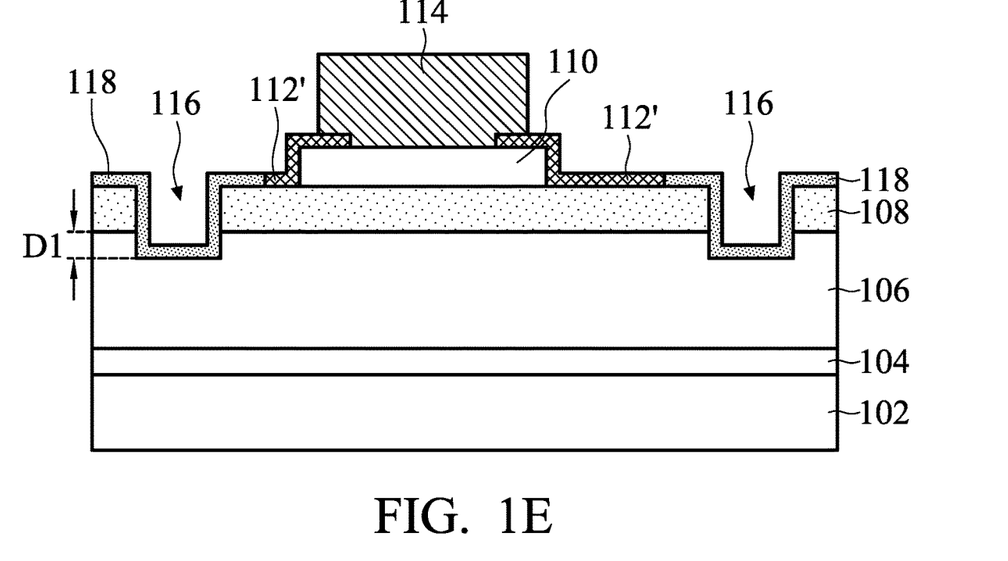
Figure 1F:
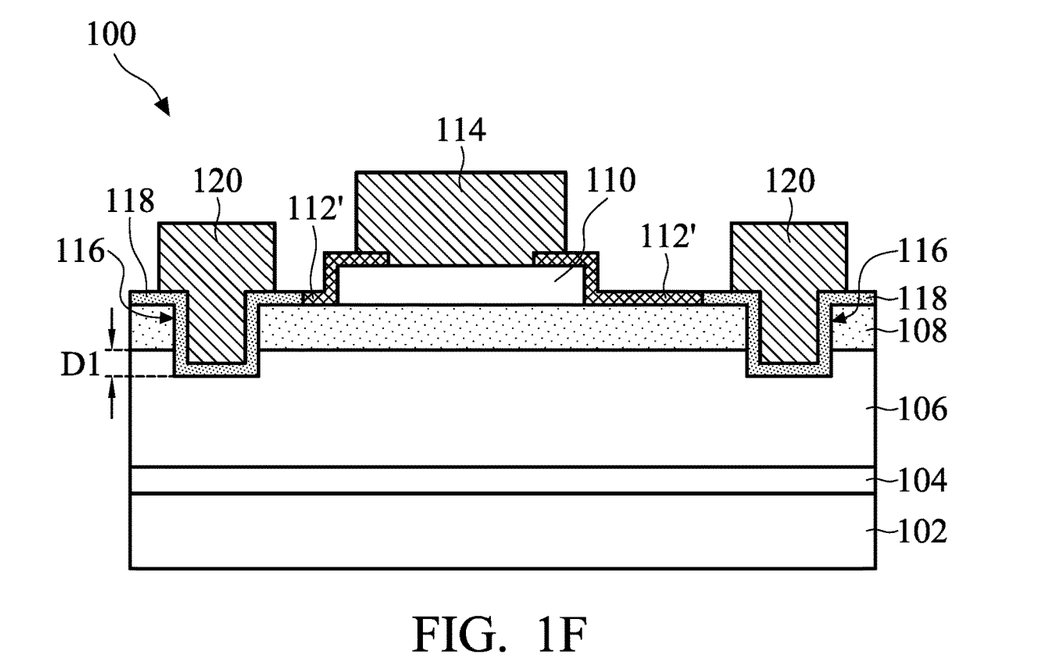

FIGS. 1A-1F illustrate cross-sectional views of forming a semiconductor device 100 shown in FIG. 1F at intermediate stages in accordance with some embodiments of the present disclosure.

Referring to FIG. 1A, a substrate 102 is provided. In some embodiments, the substrate 102 may be a doped (such as doped with a p-type or an n-type dopant) or an undoped semiconductor substrate, such as a silicon substrate, a silicon germanium substrate, a gallium arsenide substrate, or the like. In some embodiments, the substrate 102 may be a semiconductor-on-insulator substrate, such as a silicon-on-insulator (SOI) substrate. In some embodiments, the substrate 102 may be a glass substrate or a ceramic substrate, such as a silicon carbide (SiC) substrate, an aluminum nitride (AlN) substrate, or a sapphire substrate.

A buffer layer 104 is formed over the substrate 102, a channel layer 106 is formed over the buffer layer 104, and a barrier layer 108 is formed over the channel layer 106. In some embodiments, a seed layer (not shown) may be formed between the substrate 102 and the buffer layer 104.

In some embodiments, the material of the seed layer may include or be formed of aluminum nitride (AlN), aluminum oxide ($Al_2O_3$), aluminum gallium nitride (AlGaN), silicon carbide (SiC), aluminum (Al), a combination thereof, or the like. The seed layer may be a single-layer or a multilayered structure. The seed layer may be formed by an epitaxial growth process, such as metal organic chemical vapor deposition (MOCVD), hydride vapor phase epitaxy (HVPE), molecular beam epitaxy (MBE), or a combination thereof.

The buffer layer 104 may be helpful in mitigating a strain of an overlying channel layer 106 which is subsequently formed over the buffer layer 104, and to prevent defects from forming in the overlying channel layer 106. The strain is caused by a mismatch between the channel layer 106 and the substrate 102. In some embodiments, the material of the buffer layer 104 may include or be AlN, GaN, AlGaN, a combination thereof, or the like. The buffer layer 104 may be formed by using an epitaxial growth process, such as MOCVD, HVPE, MBE, a combination thereof, or the like. Although in the embodiments shown in FIG. 1A the buffer layer 104 is a single layer, the buffer layer 104 may also be a multilayered structure. In addition, the material of the buffer layer 104 is decided by the material of the seed layer and the gas introduced during the epitaxial process.

In some embodiments, the material of the channel layer 106 may include a binary group III-V compound semiconductor, such as group III nitride. In some embodiments, the material of the channel layer 106 is GaN. In some embodiments, the thickness of the channel layer 106 may be in a range from about 0.01 μm to about 10 μm. In some embodiments, the channel layer 106 may be doped, such as with an n-type or a p-type dopant. In some embodiments, the channel layer 106 may be formed by using an epitaxial growth process, such as MOCVD, HVPE, MBE, a combination thereof or the like.

In some embodiments, the material of the barrier layer 108 includes ternary group III-V compound semiconductor, such as group III nitride. In some embodiments, the material of the barrier layer 108 may be AlGaN AlInN, a combination thereof. In some embodiments, the thickness of the barrier layer 108 may be in a range from about 1 nm to about 80 nm. In some embodiments, the barrier layer 108 may be doped, such as with an n-type or a p-type dopant. In some embodiments, the barrier layer 108 may be formed by using an epitaxial growth process, such as MOCVD, HVPE, MBE, a combination thereof or the like.

Two-dimensional electron gas (2DEG, not shown) induced by a spontaneous polarization and a piezoelectric polarization between the channel layer 106 and the barrier layer 108 is formed at a heterogeneous interface between the channel layer 106 and the barrier layer 108. The semiconductor device 100 shown in FIG. 1F is a high electron mobility transistor (HEMT) which utilizes 2DEG as conductive carriers.

Still referring to FIG. 1A, a doped compound semiconductor block 110 is formed over the barrier layer 108. A gate electrode 114 (shown in FIG. 1C) is sequentially formed over the doped compound semiconductor block 110. The generation of 2DEG under the gate electrode 114 can be inhibited by the doped compound semiconductor region 110 to attain a normally-off status for the semiconductor device.

In some embodiments, the material of the doped compound semiconductor block 110 may be GaN which is doped with a p-type dopant or an n-type dopant. In some embodiments, the thickness of the doped compound semiconductor block 110 may be in a range from about 5 nm to about 150 nm. The steps of forming the doped compound semiconductor block 110 may include depositing a doped compound semiconductor layer (not shown) over the barrier 108 by using an epitaxial growth process, forming a patterned mask layer (not shown) over the doped compound semiconductor layer, performing an etching process on the doped compound semiconductor layer through the patterned mask layer to remove portions of the doped compound semiconductor layer uncovered by the patterned mask layer to form the doped compound semiconductor block 110 which corresponds to a position where the gate electrode 124 (shown in FIG. 1C) is to be formed. In some embodiments, the doped compound semiconductor layer together with the seed layer, the buffer layer 104, and the barrier layer 108 may be in-situ formed in the same deposition chamber. In addition, the doped compound semiconductor block 110 may have a rectangular shape as illustrated or may have another shape, such as a trapezoidal shape. Furthermore, the upper surface of the doped compound semiconductor block 110 may not be flat.

Referring to FIG. 1B, a protection layer 112 is formed on the sidewalls and the upper surface of the doped compound semiconductor block 110 and the upper surface of the barrier layer 108. Since lattice defects may be formed on the sidewalls of the doped compound semiconductor block 110 due to the etching process described above, the protection layer 112 formed on the sidewalls of the doped compound semiconductor block 110 can repair the lattice defects on the sidewalls of the doped compound semiconductor block 110 to reduce the gate leak current of the resulting semiconductor device. Furthermore, the protection layer 112 formed on the upper surface of the barrier layer 108 may prevent the barrier layer 108 from oxidation to enhance the performance of the resulting semiconductor device. In some embodiments, the thickness of the protection layer 112 may be in a range from about 0.5 nm to about 500 nm.

In some embodiments, the material of the protection layer 112 may include or be an insulation material or a dielectric material, such as silicon oxide ($SiO_2$), silicon nitride (SiN), silicon oxynitride (SiON), aluminum oxide ($Al_2O_3$), aluminum nitride (AlN), magnesium oxide (MgO), magnesium nitride ($Mg_3N_2$), zinc oxide (ZnO), titanium oxide ($TiO_2$), or a combination thereof. In some embodiments, the material of the protection layer 112 may be a nitride, such as silicon nitride or aluminum nitride, which can preferably repair the lattice defects at the sidewalls of the doped compound semiconductor block 110. In some embodiments, the protection layer 112 may be globally formed over the substrate 102 by using chemical vapor deposition (CVD), plasma enhanced CVD (PECVD), atomic layer deposition (ALD), physical vapor deposition (PVD) such as sputtering, or the like.

Next, a patterning process is performed on the protection layer 112.

Referring to FIG. 1C, the patterning process removes a portion of the protection layer 112 on the upper surface of the doped compound semiconductor block 110 to expose a portion of the upper surface of the doped compound semiconductor block 100, and removes portions of the protection layer 112 on the upper surface of the barrier layer 108 to expose portions of the upper surface of the barrier layer 108. After the patterning process, the remaining portion 112' of the protection layer 112 remains on the sidewalls of the doped compound semiconductor block 110 and on the upper surface of the barrier layer 108 on the opposite sides of the doped compound semiconductor block 110. In some embodiments, the protection layer 112' may also remain on the upper surface of the end portions of the doped compound semiconductor block 110, as shown in FIG. 1C. In some other embodiments, the protection layer 112 may be entirely removed from the upper surface of the doped compound semiconductor block 110.

In some embodiments, the patterning process performed on the protection layer 112 includes forming a patterned mask layer (not shown) over the barrier layer 108 to cover portions of the doped compound semiconductor block 110 and barrier layer 108 on which the protection layer 112' is to be formed, performing an etching process on the protection layer 112 through the patterned mask layer to remove portions of the protection layer 112 uncovered by the patterned mask layer to form the protection layer 112', and then removing the patterned mask layer such as by an ashing process or a wet strip process.

Still referring to FIG. 1C, a gate electrode 114 is formed over the exposed portion of the doped compound semiconductor block 110 and contacts the doped compound semiconductor block 110. In some embodiments, the material of the gate electrode 114 may include or be a conductive material, such as a metal material, a metal silicide, a semiconductor material, or a combination thereof. The metal material may be gold (Au), nickel (Ni), platinum (Pt), palladium (Pd), iridium (Ir), titanium (Ti), chromium (Cr), tungsten (W), aluminum (Al), copper (Cu), the like, a combination thereof, or multilayers thereof. The semiconductor material may be a polysilicon or a poly-germanium. The steps of forming the gate electrode 114 may include globally depositing a conductive material for the gate electrode 114 over the substrate 102, and performing a patterning process on the conductive material to form the gate electrode 114 over the doped compound semiconductor block 110. The deposition process for forming the conductive material may be ALD, CVD, PVD such as sputtering, a combination thereof, or the like.

Next, a patterning process is performed on the barrier layer 108 and the channel layer 106.

Referring to FIG. 1D, the patterning process recesses the barrier layer 108 and the channel layer 106 to form a pair of recesses 116 which extend through the barrier layer 108 and extend further into the channel layer 106. In some embodiments, the recesses 116 extend into the channel layer 106 to a first dimension D1, which may be in a range from about 100Å to about 1000Å, for example.

In some embodiments, the patterning process performed on the barrier layer 108 and the channel layer 106 includes forming a patterned mask layer (not shown) over the barrier layer 108, wherein the patterned mask layer has openings exposed portions of the upper surface of the barrier layer 108, performing an etching process on the barrier layer 108 and the channel layer 106 through the openings of the patterned mask layer to remove portions of the barrier layer 108 and the channel layer 106 uncovered by the patterned mask layer to form the pair of recesses 116, and then removing the patterned mask layer such as by an ashing process or a wet strip process. In some embodiments, the etching process may be a dry etching process, such as reactive ion etch (RIE), electron cyclotron resonance (ERC) etching, inductively-coupled plasma (ICP) etch, neutral beam etch (NBE), the like, or a combination thereof.

Generally, the etching process extends the recesses 116 into the channel layer 106 to reach a deeper etching depth so that an etching uniformity between different regions in the substrate 102 is decreased. The decreased etching uniformity can reduce the performance difference of semiconductor devices between different regions in the substrate 102, which in turn enhances the fabricating yield of semiconductor devices. Although the embodiments shown in FIGS. 1A-1F illustrate that the recesses 116 extend into the channel layer 106, the recesses 116 may only extend through portions of the barrier layer 108 and may not extend into the channel layer 106 (shown in FIGS. 2 and 4).

Referring to FIG. 1E, a lining layer 118 is conformally formed in the pair of recesses 116 and on the upper surface of the barrier layer 108. The lining layer 118 is conformally formed in the bottom surfaces and the sidewalls of the pair of recesses 116 to partially fill the pair of recesses 116. The lining layer 118 is conformally formed on the upper surface of the barrier layer 108 to interface with the protection layer 112'. In some embodiments, the thickness of the lining layer 118 may be in a range from about 0.5 nm to about 4 nm, such as 2 nm.

In some embodiments, the material of the lining layer 118 may include or be a hexagonal crystal binary compound semiconductor, such as aluminum nitride (AlN), zinc oxide (ZnO), indium nitride (InN), a combination thereof, or the like. The lining layer 118 may be formed over the substrate 102 by using ALD or an epitaxial growth process, such as MOCVD. In an embodiment shown in FIG. 1E in which the lining layer 118 is formed by MOCVD, since MOCVD is a selective area growth (SAG) process, the lining layer 118 is formed on portions of the barrier layer 108 uncovered by the protection layer 112' to interface with the protection layer 112' and does not be formed above the protection layer 112'. In another embodiment in which the lining layer 118 formed by ALD, the lining layer 118 is not only formed on portions of the barrier layer 108 uncovered by the protection layer 112' but extends above the protection layer 112'. In addition, in some other embodiments, the material of the lining layer 118 may include or be graphene with a hexagonal crystal, and the lining layer 118 may be formed by using CVD or ALD.

In some embodiments, the material of the lining layer 118 may be the same as the material of the protection layer 112', such as both are AlN. In some other embodiments, the material of the lining layer 118 may be different from the material of the protection layer 112', such as the lining layer 118 is AlN and the protection layer 112' is SiN.

Referring to FIG. 1F, after the lining layer 118 is formed, a pair of source/drain electrodes 120 are formed in the respective remaining portions of the pair of recesses 116 on the opposite sides of gate electrode 115. The source/drain electrodes 120 have upper portions above the upper surface of the barrier layer 108 and lower portions in the recesses 116.

In some embodiments, the material of the source/drain electrodes may include or be a conductive material, such as a metal material, a metal silicide or a semiconductor material. The metal material may be gold (Au), nickel (Ni), platinum (Pt), palladium (Pd), iridium (Ir), titanium (Ti), chromium (Cr), tungsten (W), aluminum (Al), copper (Cu), the like, a combination thereof, or multilayers thereof. The semiconductor material may be a polysilicon or a polygermanium. The steps of forming the source/drain electrodes 120 may include globally depositing a conductive material (not shown) for the source/drain electrodes 120 over the substrate 102 to fill the remaining portions of the recesses 116, and performing a patterning process on the conductive material to form the source/drain electrodes 120 in the recesses 116 and over the upper surface of the barrier layer 108. The deposition process for forming the source/drain electrodes 120 may be ALD, CVD, PVD such as sputtering, a combination thereof, or the like.

After the pair of source/drain electrodes 120 are formed, a semiconductor device 100 is produced.

In the embodiments shown in FIG. 1A-1F, the semiconductor device 100 includes the substrate 102, the channel layer 106 disposed over the substrate 102, and the barrier layer 108 disposed over the channel layer 106. The semiconductor device 100 also includes the gate electrode 114 disposed over the barrier layer 108, and the pair of source/drain electrodes 120 disposed on opposite sides of the gate electrode 114. The pair of source/drain electrodes 120 extend through the barrier layer 108 and extend into the channel layer 106. The semiconductor device 100 also includes the lining layer 118 conformally disposed on bottom portions of the pair of source/drain electrodes 120. The lining layer 118 is conformally disposed between the bottom portions the pair of source/drain electrodes 120 and the channel layer 106 and between the bottom portions of the pair of source/drain electrodes 120 and the barrier layer 108.

In the embodiments shown in FIGS. 1A-1F, the recesses 116 for forming the source/drain electrodes 120 extend through the barrier layer 108 and extend further into the channel layer 106 so that the heterogeneous interface between the channel layer 106 and the barrier layer 108 is not present in the region where the source/drain electrodes are formed, which reduces or eliminates 2DEG formed beneath the source/drain electrodes 120. It should be noted that since the lining layer 118 including a hexagonal crystal binary compound semiconductor or a graphene with a hexagonal crystal is formed between the bottom portions of the source/drain electrodes and the channel layer 106, the spontaneous polarization and the piezoelectric polarization can be induced between the lining layer 118 and the channel layer 106 and the barrier layer 108 to recover the reduced or eliminated 2DEG described above. Thus, the lining layer 118 can serve as a 2DEG recovery layer to reduce the $R_{contact}$ between the source/drain electrode 120 and the channel layer 106, which in turn reduces the $R_{on}$ of the semiconductor device 100.

In addition, the stronger spontaneous polarization and piezoelectric polarization can be induced between the binary compound semiconductor of the lining layer 118 and the channel layer 106 when compared to being induced between a ternary compound semiconductor of the barrier layer 108 and the channel layer 106. Thus, the lining layer is helpful in generating more 2DEG at the heterogeneous interface beneath the source/drain electrodes, which further reduces the $R_{contact}$ between the source/drain electrode 120 and the channel layer 106.

The embodiments shown in FIGS. 1A-1F are merely examples and are not intended to be limiting. The methods of the present disclosure may be also applied to other semiconductor devices except for the embodiments shown in FIGS. 1A-1F.

Figure 2:
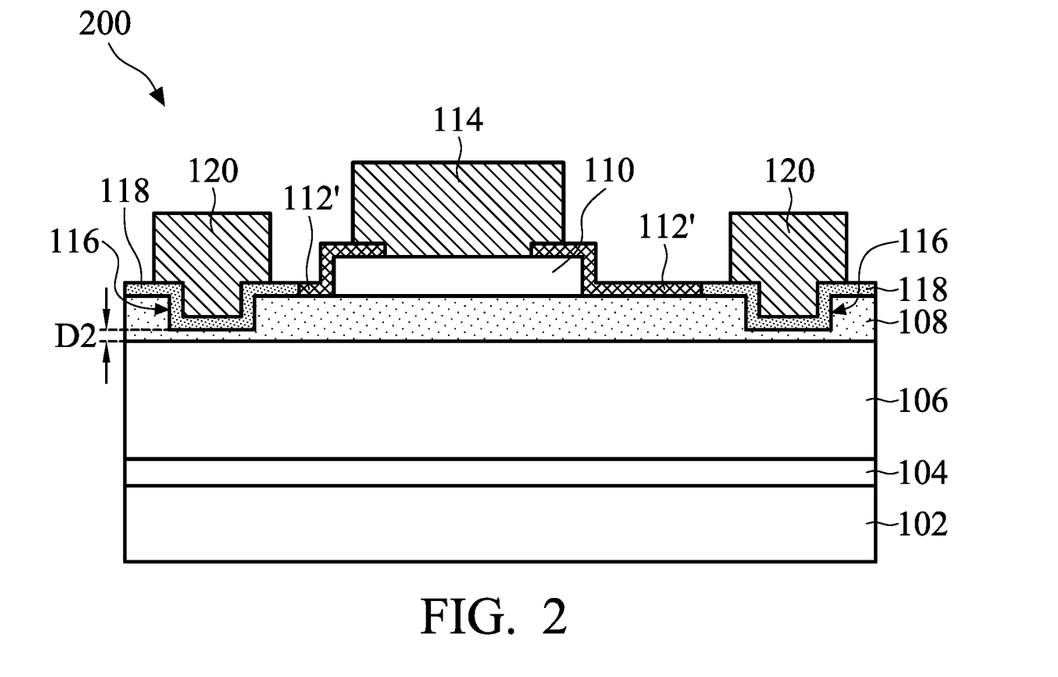
FIG. 2 is a cross-sectional view of a semiconductor device in accordance with some other embodiments of the present disclosure.

FIG. 2 is a cross-sectional view of a semiconductor device 200 in accordance with some other embodiments of the present disclosure. Elements or layers in FIG. 2 that are the same or similar to those in FIGS. 1A-1F are denoted by like reference numerals that have the same meaning, and the description thereof will not be repeated for the sake of brevity. The difference between the embodiments shown in FIGS. 2 and 1F is that the recesses 116 in FIG. 2 extend through portions of the barrier layer 108 and do not extend into the channel layer 106.

Referring to FIG. 2, by performing a patterning process similar to the one described in FIG. 1D, the barrier layer 108 becomes recessed to form a pair of recesses 116 through portions of the barrier layer 108. After the patterning process, the bottom surfaces of the recesses 116 stop in the interior of the barrier layer 108. A portion of the barrier layer 108 under the recess 116 has a second dimension D2, which may be in a range from about 50Å to about 200Å, for example.

In the embodiments shown in FIG. 2, the lining layer 118 is conformally disposed between the bottom portions of the source/drain electrodes 120 and the barrier layer 108 thereby enhancing the spontaneous polarization and the piezoelectric polarization between the lining layer 118 and the channel layer 106. Thus, the lining layer 118 is helpful in generating more 2DEG at the heterogeneous interface beneath the source/drain electrodes to reduce the $R_{contact}$ between the source/drain electrode 120 and the channel layer 106, which in turn reduces the $R_{on}$ of the semiconductor device 200.

Figure 3A:
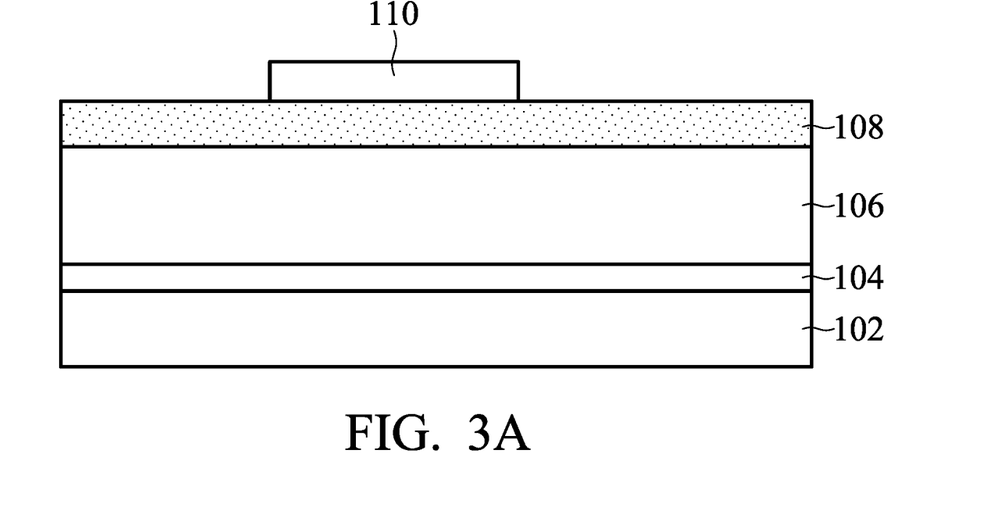
FIGS. 3A-3E illustrate cross-sectional views of forming a semiconductor device at intermediate stages in accordance with some embodiments of the present disclosure.
Figure 3B:
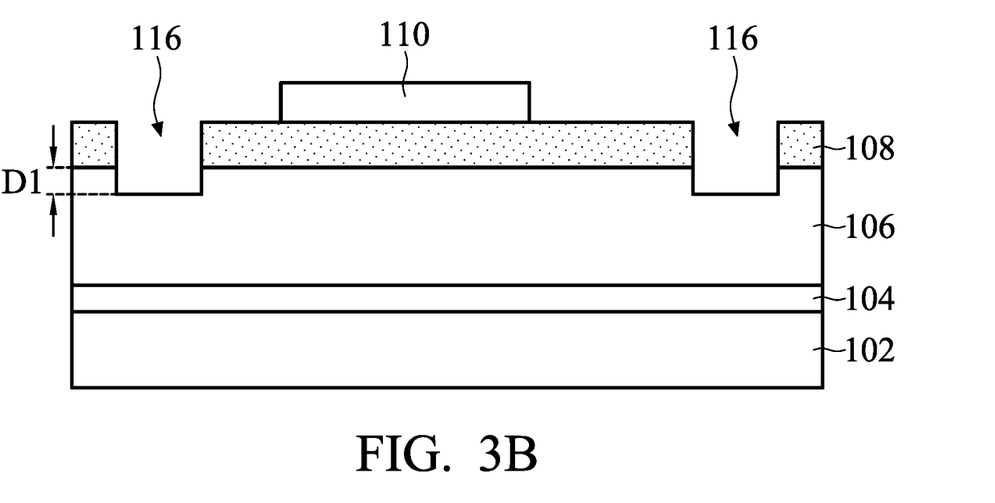
Figure 3C:
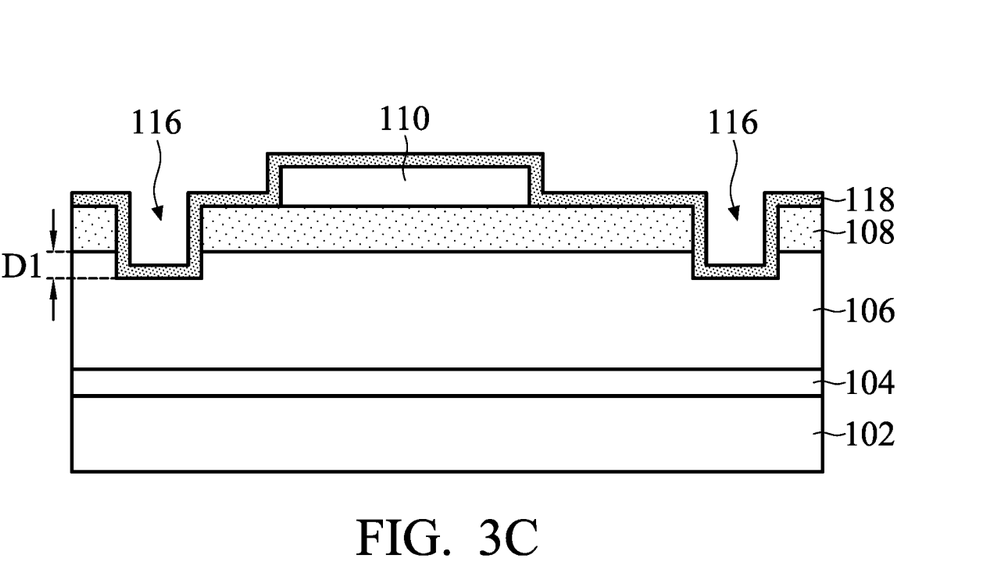
Figure 3D:
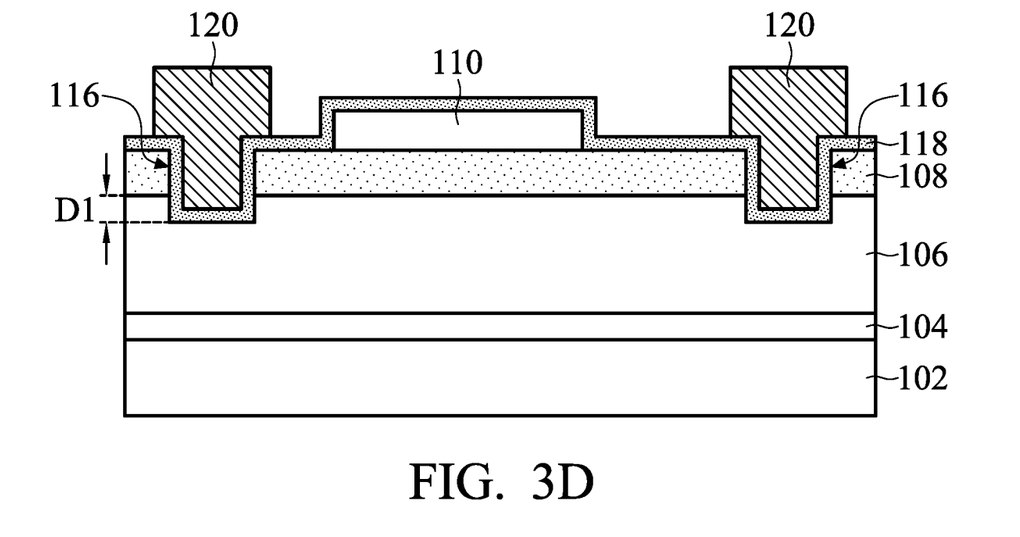
Figure 3E:
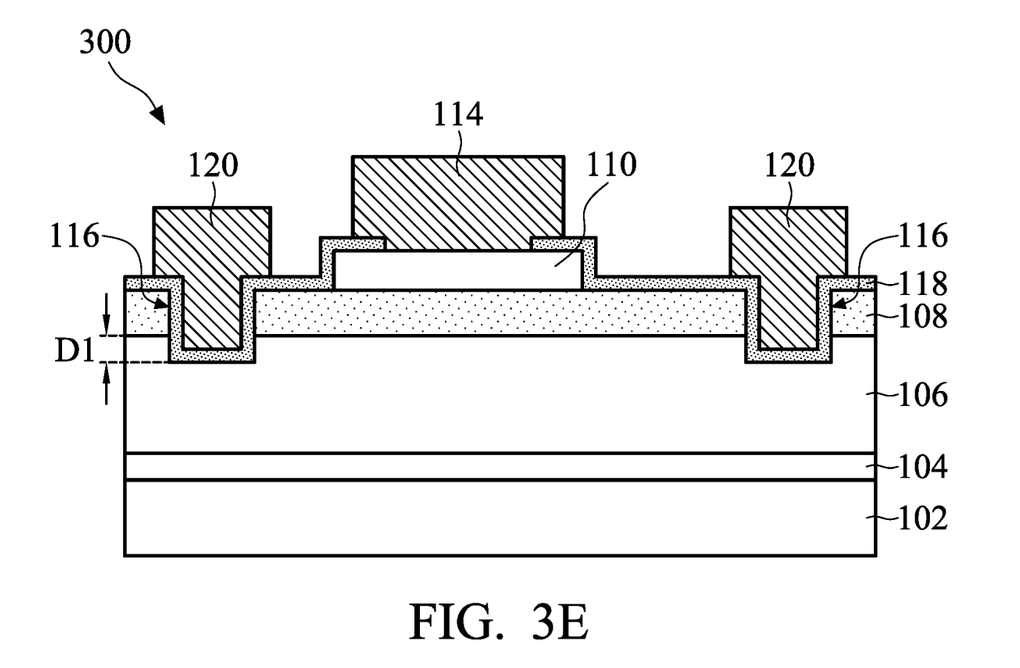

FIGS. 3A-3E are cross-sectional views of forming a semiconductor device 300 shown in FIG. 3E in accordance with some embodiments of the present disclosure. Elements or layers in FIGS. 3A-3E that are the same or similar to those in FIGS. 1A-1F are denoted by like reference numerals that have the same meaning, and the description thereof will not be repeated for the sake of brevity. The difference between the embodiments shown in FIGS. 3A-3E and 1A-1F is that the semiconductor device 300 does not include the protection layer 112' shown in FIG. 1F. In addition, in the embodiments shown in FIGS. 3A-3E, the lining layer 118 replaces the protection layer 112' in FIG. 1F to be formed on sidewalls of the doped compound semiconductor block 110.

Referring to FIG. 3A, a substrate 102 is provided. A buffer layer 104, a channel layer 106 and a barrier layer 108 are sequentially formed over the substrate 102. In some embodiments, a seed layer (not shown) may be formed between the substrate 102 and the buffer layer 104. Next, a doped compound semiconductor block 110 is formed over the barrier layer 108. In some embodiments, the material and the formation method of the buffer layer 104, the channel layer 106, the barrier layer 108 and the doped compound semiconductor block 110 may be the same as or similar to those of the buffer layer 104, the channel layer 106, the barrier layer 108 and the doped compound semiconductor block 110 described in FIG. 1A.

Next, a patterning process is performed on the barrier layer 108 and the channel layer 106.

Referring to FIG. 3B, the patterning process recesses the barrier layer 108 and the channel layer 106 to form a pair of recesses 116 which extend the barrier layer 108 and extend further into the channel layer 106. In some embodiments, the recesses 116 extend into the channel layer 106 to a first dimension D1, which may be in a range from about 100Å to about 1000Å, for example. In some embodiments, the patterning process may be the same or similar to the one described in FIG. 1D.

In the embodiments shown in FIGS. 3A-3E, before the recesses 116 are formed, the protection layer 112 as shown in FIG. 1B is not formed on the sidewalls and the upper surface of the doped compound semiconductor block 110 and the upper surface of the barrier layer 108.

Referring to FIG. 3C, a lining layer 118 is formed conformally in the pair of recesses 116, on the upper surface of the barrier layer 108, and on the sidewalls and the upper surface of the doped compound semiconductor block 110. The lining layer 118 is conformally formed in the bottom surfaces and the sidewalls of the pair of recesses 116 to partially fill the pair of recesses 116. In some embodiments, the thickness of the lining layer 118 may be in a range from about 0.5 nm to about 4 nm, such as 2 nm. The lining layer 118 formed on the sidewalls of the doped compound semiconductor block 110 can repaid the lattice defects on the sidewalls of the doped compound semiconductor block 110 to reduce the gate leak current of the resulting semiconductor device. Furthermore, the lining layer 118 formed on the upper surface of the barrier layer 108 may prevent the barrier layer 108 from oxidation to enhance the performance of the resulting semiconductor device.

In some embodiments, the material of the lining layer 118 may include or be a hexagonal crystal binary compound semiconductor, such as aluminum nitride (AlN), zinc oxide (ZnO), indium nitride (InN), a combination thereof, or the like. The lining layer 118 may be formed over the substrate 102 by using ALD or epitaxial growth process, such as MOCVD. It should be noted that since the lining layer 118 is formed on the sidewalls and the upper surface of the doped compound semiconductor block 110, in order not to affect the gate leak current of the resulting semiconductor device, the material of the lining layer 118 in this embodiment does not include a graphene due to its high conductivity.

Referring to FIG. 3D, after the lining layer 118 is formed, a pair of source/drain electrodes 120 is formed in the respective remaining portions of the pair of recesses 116. The source/drain electrodes 120 have upper portions above the upper surface of the barrier layer 108 and lower portions in the recesses 116. In some embodiments, the material and the formation method of the source/drain electrodes 120 are the same as or similar to those of the source/drain electrodes 120 described above in FIG. 1F.

Next, a patterning process is performed on the lining layer 118.

Referring to FIG. 3E, the patterning process removes a portion of the lining layer 118 on the upper surface of the doped compound semiconductor block 110 to expose a portion of the upper surface of the doped compound semiconductor block 100. In some embodiments, the lining layer 118 may also remain on the upper surface of the end portions of the doped compound semiconductor block 110, as shown in FIG. 3E. In some other embodiments, the lining layer 118 may be entirely removed from the upper surface of the doped compound semiconductor block 110. In some embodiments, the patterning process may be the same as or similar to that described above in FIG. 1C.

Still referring to FIG. 3E, a gate electrode 114 is formed over the exposed portion of the doped compound semiconductor block 110 and contacts the doped compound semiconductor block 110. In some embodiments, the material and the formation method of the gate electrode 114 may be the same as or similar to those of the gate electrode 114 described above in FIG. 1C.

After the gate electrode 114 is formed, a semiconductor device 300 is produced.

In the embodiments shown in FIGS. 3A-3E, the semiconductor 300 includes the lining layer 118 conformally disposed on the bottom portions of the pair of source/drain electrodes 120. The lining layer 118 is conformally disposed between the bottom portions of the pair of source/drain electrodes 120 and the channel layer 106 and between the bottom portions of the pair of source/drain electrodes 120 and the barrier layer 108. The lining layer 118 is further conformally disposed on the upper surface of the barrier layer 108 and on the sidewalls of the doped compound semiconductor block 110.

In the embodiments shown in FIGS. 3A-3E, the lining layer 118 conformally disposed on the bottom portions of the source/drain electrodes 120 can serve as 2DEG a recovery layer to reduce the $R_{contact}$ between the source/drain electrode 120 and the channel layer 106. In addition, the lining layer 118 conformally disposed on the sidewalls of the doped compound semiconductor block 110 can serve as a lattice-repaired layer to reduce the gate leak current of the semiconductor device 300. Thus, the performance of the semiconductor device 300 is enhanced.

Furthermore, the embodiments shown in FIGS. 3A-3E use the lining layer 118 formed on the sidewalls of the doped compound semiconductor block 110 instead of the protection layer 112' shown in FIG. 1F so that one deposition process can be omitted. Thus, the manufacturing efficiency of the semiconductor device 300 can be enhanced.

Figure 4:
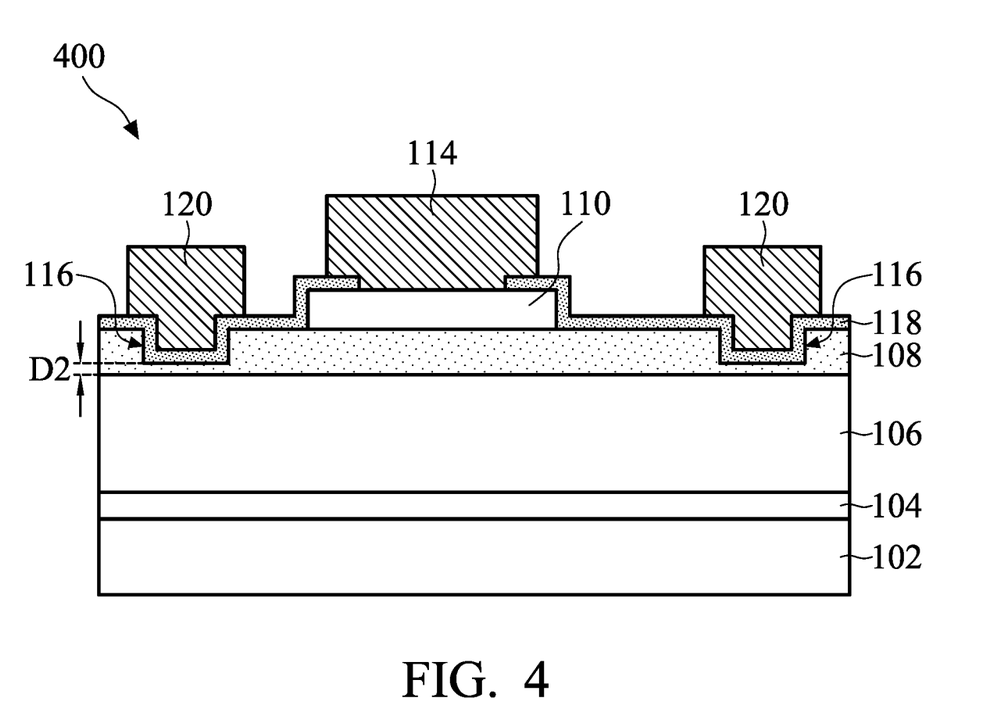
FIG. 4 is a cross-sectional view of a semiconductor device in accordance with some other embodiments of the present disclosure.

FIG. 4 is a cross-sectional view of a semiconductor device 400 in accordance with some other embodiments of the present disclosure. Elements or layers in FIG. 4 that are the same or similar to those in FIGS. 1A-1F are denoted by like reference numerals that have the same meaning, and the description thereof will not be repeated for the sake of brevity. The difference between the embodiments shown in FIGS. 4 and 3E is that the recesses 116 in FIG. 4 extend through portions of the barrier layer 108 and do not extend into the channel layer 106.

Referring to FIG. 4, by a patterning process similar to that described in FIG. 1D, the barrier layer 108 is recessed to form a pair of recesses 116 through portions of the barrier layer 108. After the patterning process, the bottom surfaces of the recesses 116 stop in the interior of the barrier layer 108. A portion of the barrier layer 108 under the recess 116 has a second dimension D2, which may be in a range from about 50Å to about 200Å, for example.

In the embodiments shown in FIG. 4, the lining layer 118 is conformally disposed between the bottom portions of the source/drain electrodes 120 and the barrier layer 108 thereby enhancing the spontaneous polarization and the piezoelectric polarization between the lining layer 118 and the channel layer 106. Thus, the lining layer 118 is helpful in generating more 2DEG at the heterogeneous interface beneath the source/drain electrodes to reduce the $R_{contact}$ between the source/drain electrode 120 and the channel layer 106, which in turn reduces the $R_{on}$ of the semiconductor device 400.

In summary, in the embodiments of the present disclosure, the semiconductor devices include a lining layer disposed on the bottom portions of the source/drain electrodes. The lining layer can recover or increase 2DEG beneath the source/drain electrodes. Thus, the On-Resistance ($R_{on}$) of the semiconductor device can be reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a channel layer disposed over a substrate;
   a barrier layer disposed over the channel layer;
   a gate electrode disposed over the barrier layer;
   a doped compound semiconductor block disposed between the gate electrode and the barrier layer;
   a pair of source/drain electrodes disposed on opposite sides of the gate electrode and extending through at least portions of the barrier layer; and
   a lining layer conformally disposed on bottom portions of the pair of source/drain electrodes and sidewalls of the doped compound semiconductor block.

2. The semiconductor device as claimed in claim 1, wherein a material of the barrier layer includes a ternary compound semiconductor and a material of the lining layer includes a hexagonal crystal binary compound semiconductor or a graphene.

3. The semiconductor device as claimed in claim 1, wherein a material of the lining layer includes AlN, ZnO, InN, or a combination thereof.

4. The semiconductor device as claimed in claim 1, wherein the pair of source/drain electrodes further extends into the channel layer.

5. The semiconductor device as claimed in claim 1, wherein the lining layer further conformally disposed between the bottom portions of the pair of source/drain electrodes and the channel layer; and the lining layer conformally disposed between the bottom portions of the pair of source/drain electrodes and the barrier layer.

6. The semiconductor device as claimed in claim 1, wherein the lining layer is disposed further on an upper surface of the barrier layer.

7. A semiconductor device, comprising:
   a channel layer disposed over a substrate;
   a barrier layer disposed over the channel layer;
   a gate electrode disposed over the barrier layer;
   a doped compound semiconductor block disposed between the gate electrode and the barrier layer;
   a pair of source/drain electrodes disposed on opposite sides of the gate electrode and extending through at least portions of the barrier layer;
   a lining layer conformally disposed on bottom portions of the pair of source/drain electrodes; and
   a protection layer conformally disposed on sidewalls of the doped compound semiconductor block and an upper surface of the barrier layer, wherein the protection layer interfaces with the lining layer at the upper surface of the barrier layer.

8. The semiconductor device as claimed in claim 7, wherein a material of the lining layer is different from a material of the protection layer.

9. The semiconductor device as claimed in claim 7, wherein a material of the barrier layer includes a ternary compound semiconductor and a material of the lining layer includes a hexagonal crystal binary compound semiconductor or a graphene.

10. The semiconductor device as claimed in claim 7, wherein the lining layer further conformally disposed between the bottom portions of the pair of source/drain electrodes and the channel layer; and the lining layer conformally disposed between the bottom portions of the pair of source/drain electrodes and the barrier layer.

11. A method for fabricating a semiconductor device, comprising:
    forming a channel layer over a substrate;
    forming a barrier layer over the channel layer;
    recessing the barrier layer to form a pair of recesses through at least portions of the barrier layer;
    conformally forming a lining layer in the pair of recesses;
    forming a pair of source/drain electrodes in respective remaining portions of the pair of recesses;
    forming a doped compound semiconductor block and a gate electrode over the barrier layer, wherein the gate electrode is formed over the doped compound semiconductor block and the pair of source/drain electrodes are located on opposite sides of the gate electrode, and the lining layer is further formed on sidewalls and an upper surface of the doped compound semiconductor block; and
    removing a portion of the lining layer over the upper surface of the doped compound semiconductor block to expose a portion of the doped compound semiconductor block, wherein the gate electrode is formed over the exposed portion of the doped compound semiconductor block.

12. The method as claimed in claim 11, wherein a material of the barrier layer includes a ternary compound semiconductor and a material of the lining layer includes a hexagonal crystal binary compound semiconductor or a graphene.

13. The method as claimed in claim 11, wherein a material of the lining layer includes AlN, ZnO, InN, or a combination thereof.

14. The method as claimed in claim 11, wherein recessing the barrier layer further comprises recessing the channel layer so that the pair of recesses extend through the barrier layer and extend further into the channel layer.

15. The method as claimed in claim 11, wherein the lining layer is conformally formed on bottom surfaces and sidewalls of the pair of recesses.

16. The method as claimed in claim 11, wherein the lining layer is further conformally formed on an upper surface of the barrier layer.

17. A method for fabricating a semiconductor device, comprising:
    forming a channel layer over a substrate;
    forming a barrier layer over the channel layer;
    recessing the barrier layer to form a pair of recesses through at least portions of the barrier layer;
    conformally forming a lining layer in the pair of recesses;
    forming a pair of source/drain electrodes in respective remaining portions of the pair of recesses; and
    forming a doped compound semiconductor block and a gate electrode over the barrier layer, wherein the gate electrode is formed over the doped compound semiconductor block and the pair of source/drain electrodes are located on opposite sides of the gate electrode;

conformally forming a protection layer on sidewalls and an upper surface of the doped compound semiconductor block and an upper surface of the barrier layer before the barrier layer is recessed, and removing a portion of the protection layer over the upper surface of the doped compound semiconductor block to expose a portion of the doped compound semiconductor block, wherein the gate electrode is formed over the exposed portion of the doped compound semiconductor block.

18. The method as claimed in claim 17 wherein a material of the lining layer is different from a material of the protection layer.

19. The method as claimed in claim 17, wherein recessing the barrier layer further comprises recessing the channel layer so that the pair of recesses extend through the barrier layer and extend further into the channel layer.

20. The method as claimed in claim 17, wherein the lining layer is conformally formed on bottom surfaces and sidewalls of the pair of recesses.

* * * * *